United States Patent
Allen et al.

(10) Patent No.: US 7,484,197 B2
(45) Date of Patent: Jan. 27, 2009

(54) MINIMUM LAYOUT PERTURBATION-BASED ARTWORK LEGALIZATION WITH GRID CONSTRAINTS FOR HIERARCHICAL DESIGNS

(75) Inventors: Robert J. Allen, Jericho, VT (US); Michael S. Gray, Fairfax, VT (US); Fook-Luen Heng, Yorktown Heights, NY (US); Jason D. Hibbeler, Williston, VT (US); Kevin W. McCullen, Essex Junction, VT (US); Rani R. Narayan, San Jose, CA (US); Robert F. Walker, St. George, VT (US); Xin Yuan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 11/279,758

(22) Filed: Apr. 14, 2006

(65) Prior Publication Data

US 2007/0245283 A1    Oct. 18, 2007

(51) Int. Cl.
    *G06F 17/50* (2006.01)
(52) U.S. Cl. ...................................... 716/10
(58) Field of Classification Search .................. 716/10, 716/9; 703/2
    See application file for complete search history.

(56) References Cited

U.S. PATENT DOCUMENTS

| | | | |
|---|---|---|---|
| 5,636,132 A | 6/1997 | Kamdar | |
| 6,189,132 B1 | 2/2001 | Heng et al. | |
| 2004/0230922 A1* | 11/2004 | Allen et al. | 716/2 |
| 2005/0125748 A1 | 6/2005 | Gray et al. | |
| 2006/0101357 A1* | 5/2006 | Allen et al. | 716/3 |
| 2007/0240088 A1* | 10/2007 | Tang et al. | 716/9 |

OTHER PUBLICATIONS

Xin Yuan et al., "Technology Migration Technique for Designs with Strong RET-driven Layout Restrictions", ISPD '05, Apr. 3-6, 2005, San Francisco, California, USA.

* cited by examiner

*Primary Examiner*—Stacy A Whitmore
(74) *Attorney, Agent, or Firm*—Richard M. Kotulak; Greenblum & Bernstein P.L.C.

(57) ABSTRACT

A method comprises extracting a hierarchical grid constraint set and modeling one or more critical objects of at least one cell as a variable set. The method further comprises solving a linear programming problem based on the hierarchical grid constraint set with the variable set to provide initial locations of the critical objects of the at least one cell and determining target on-grid locations of the one or more critical objects in the at least one cell using the results of the linear programming solution.

20 Claims, 13 Drawing Sheets

MINIMUM LAYOUT PERTURBATION-BASED ARTWORK LEGALIZATION WITH GRID CONSTRAINTS FOR HIERARCHICAL DESIGNS

FIELD OF THE INVENTION

The invention relates to the design of integrated circuits, and more particularly, to a system and method for legalizing hierarchical object layouts with critical grid constraints.

BACKGROUND OF THE INVENTION

Techniques for designing layouts that comply with ground rules and grid constraints include compaction and minimum layout perturbation (MinPert) based legalization. The compaction technique minimizes the area of the layout by relocating objects while satisfying rules and constraints. This technique is based on the longest path algorithm. There are known compaction techniques for flat layouts with ground rules, ground rules and single grid constraints, and ground rules with multiple grid constraints. There are also known compaction techniques for hierarchical layouts with ground rules. However, the compaction technique does not handle multiple grid constraints for a hierarchical layout. Furthermore, the iteration bound which is used to check whether there is a feasible compaction solution to satisfy the given constraints (e.g., whether there is a positive cycle in the grid longest path) is not accurate.

MinPert-based legalization is an alternative to compaction, as disclosed in U.S. Pat. No. 6,189,132, which is hereby incorporated by reference in its entirety. Unlike the traditional compaction technique, which mainly considers area minimization, MinPert-based legalization attempts to improve a given layout by correcting ground rule violations while changing the original layout as little as possible. MinPert-based legalization is advantageous because it addresses cases with conflicting rules that cause positive cycles and cannot be handled by the conventional compaction techniques. MinPert-based legalization does not address grid constraints.

Figure 1A:
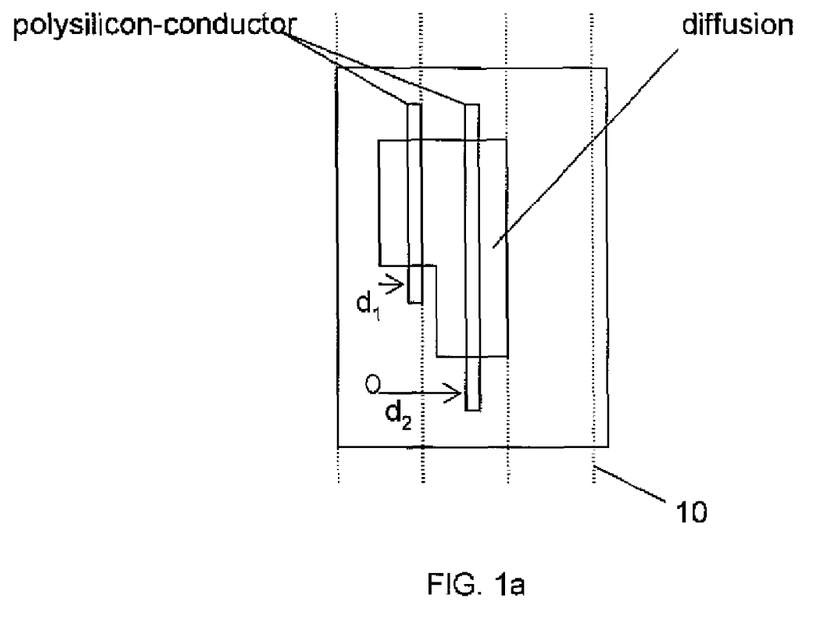
FIGS. 1a and 1b are illustrative examples of a flat layout with grid constraints, before and after legalization.
Figure 1B:
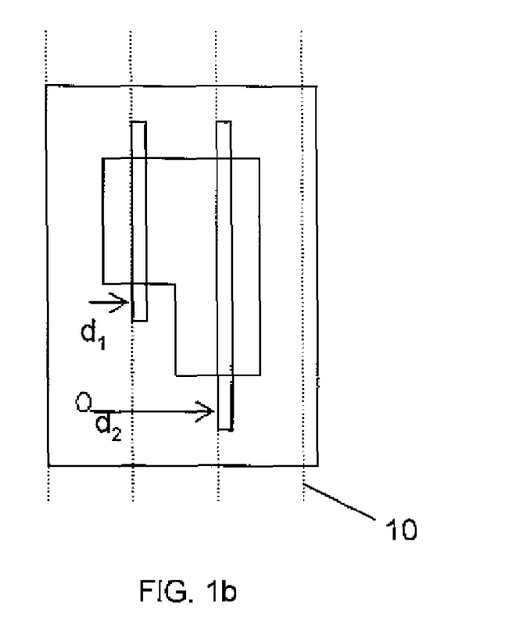

Solutions exist for legalization of a flat layout with critical grid constraints (e.g., grid constraints where only the transistors (e.g., critical gates) are required to be on the grid), and for legalization of flat and hierarchical designs with multiple grid constraints. An example of critical grid constraint legalization for a flat layout (or leaf cell) is shown in FIGS. 1a and 1b. In this example, the layout of the cell consists of two gates where polysilicon-conductor shapes intersect with diffusion shapes. Before legalization, as shown in FIG. 1a, the left edges of the gates (the placement of which is shown by the distances from the origin of the cell to the left edges of the gate, $d_1$ and $d_2$) are not aligned on the pre-defined grid 10. After legalization, as shown in FIG. 1b, though, the left edges of the gates (the placement of which is shown by the revised distances $e_1$ and $e_2$) have both been moved such that they are placed on the grid 10.

Figure 2A:
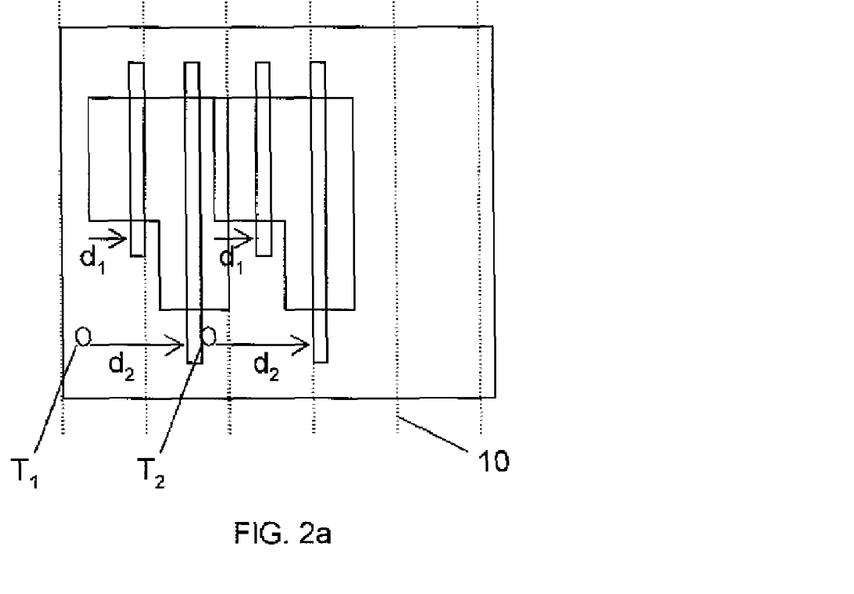
FIGS. 2a and 2b are illustrative examples of a hierarchical layout with critical grid constraints, before and after legalization.
Figure 2B:
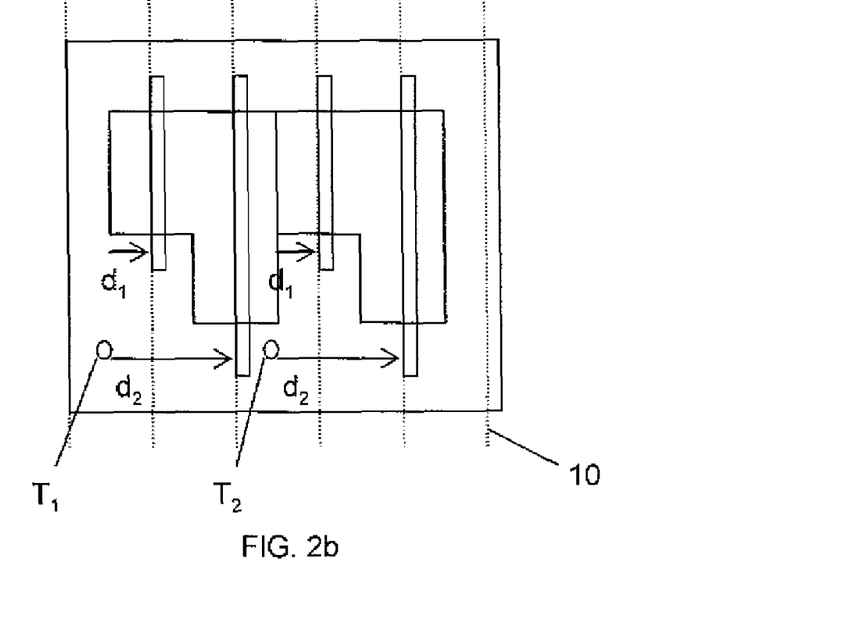

In contrast, an example of legalization for a hierarchical layout with critical grid constraints is shown in FIGS. 2a and 2b. In order to legalize a hierarchical layout with critical grid constraints, not only the edges of the gates but also the transforms of the instances have to be moved in order to place the gates on the grid. And, the hierarchical constraints (that is, consistent placement results among all instances of the same model or cell) must also be maintained. As can be seen in FIGS. 2a and 2b, a cell consists of two gates which are placed at distance of $d_1$ and $d_2$ from the cell origin, and the hierarchical layout includes two instances of the cell and the transforms of these instances $T_1$ and $T_2$. Before legalization, as shown in FIG. 2a, the left edges of the gates are not aligned on the pre-defined grid 10. The grid constraints are:

$$d_2 - d_1 = P;\ \text{and}$$

$$(T_2 + d_1) - (T_1 + d_2) = P,$$

where P is the pitch of the grid. From these constraints it can be seen that:

$$(T_2 - T_1) = P + (d_2 - d_1).$$

If the transforms are fixed and given and $T_2 - T_1 \neq 2P$, then it can be seen that it is impossible to satisfy both the first and the second constraints. Thus, the transforms must be moved to the solution as graphically shown in FIG. 2b. Solutions for such hierarchical designs including critical grid constraints, though, do not currently exist.

SUMMARY OF THE INVENTION

In a first aspect of the invention, a method comprises extracting a hierarchical grid constraint set and modeling one or more critical objects of at least one cell as a variable set. The method further comprises solving a linear programming problem based on the hierarchical grid constraint set with the variable set to provide initial locations of the critical objects of the at least one cell and determining target on-grid locations of the one or more critical objects in the at least one cell using the results of the linear programming solution.

In a second aspect of the invention, a system for legalizing artwork comprises at least one device configured to: extract a hierarchical grid constraint set; model one or more critical objects of the at least one cell including native gates and transforms as variables; formulate a linear programming problem based on the hierarchical grid constraint set under minimum perturbation objectives with the variables under consideration; solve the linear programming problem to provide initial locations of the critical objects of the at least one cell; and for each cell which does not contain unplaced nested cells, determine target on-grid locations of the one or more critical objects using the results of the linear programming solution. The system may also be a computer program product.

In a third aspect of the invention, a computer program product comprises a computer useable medium including a computer readable program, wherein the computer readable program, when executed on a computer, causes the computer to extract a hierarchical grid constraints and model critical objects of at least one cell as variables. The computer program product further causes the computer to solve a linear programming problem based on the hierarchical grid constraints with the variables to provide initial locations of the critical objects and determine target on-grid locations of the one or more critical objects using the results of the linear programming solution.

DETAILED DESCRIPTION OF EMBODIMENTS OF THE INVENTION

The method of the invention is an iterative hybrid between a linear programming (LP) formulation and a critical shape placement (CSP) solver. The process of the CSP solver is disclosed in co-pending U.S. application Ser. No. 10/904,225, which is hereby incorporated by reference in its entirety. In embodiments, an integer linear programming (ILP) formulation captures constraints from a hierarchy, which are then relaxed to a general linear programming problem. The LP problem is solved in order to obtain a solution with a global picture. A flat critical shape neighborhood (CSN) graph of the root is then used to extract the hierarchical grid constraints. The process of a legalization technique for integrated circuit designs with multiple grid constraints is disclosed in co-pending U.S. application Ser. No. 11/279,283 filed on Apr. 11, 2006, which is hereby incorporated by reference in its entirety.

Figure 3:
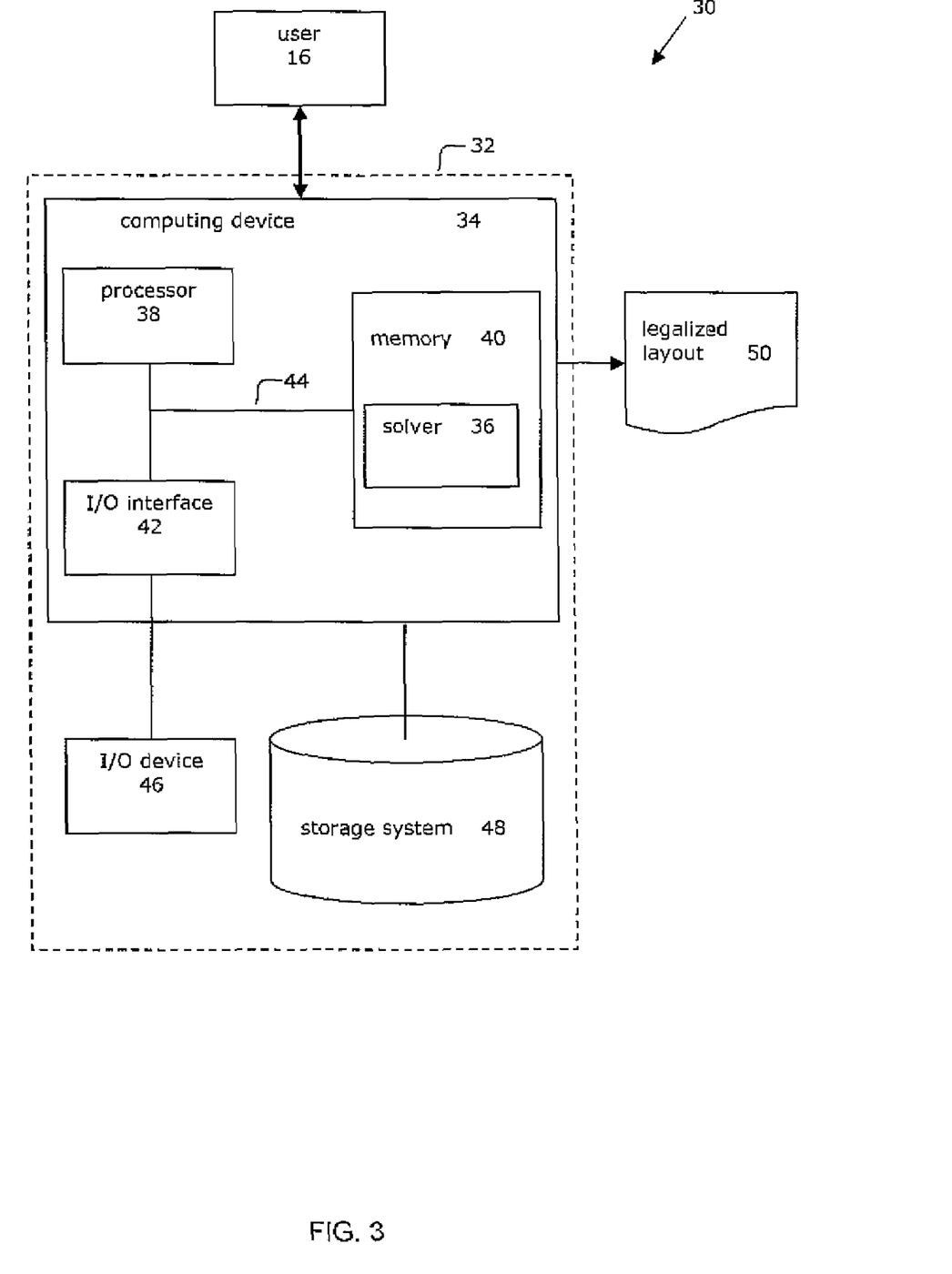
FIG. 3 shows an environment for implementing an aspect of the invention.

With reference to the accompanying drawings, FIG. 3 shows an illustrative environment 30 for managing the processes in accordance with the invention. To this extent, the environment 30 includes a computer infrastructure 32 that can perform the processes described herein. In particular, the computer infrastructure 32 is shown including a computing device 34 that comprises a solver 36, which makes computing device 34 operable to perform the processes described herein. The computing device 34 is shown including a processor 38, a memory 40, an input/output (I/O) interface 42, and a bus 44. Further, the computing device 34 is shown in communication with an external I/O device/resource 46 and a storage system 48. As is known in the art, in general, the processor 38 executes computer program code, which is stored in memory 40 and/or storage system 48. While executing computer program code, the processor 38 can read and/or write data, such as the legalized layout 50, to/from memory 40, storage system 48, and/or I/O interface 42. The bus 44 provides a communications link between each of the components in the computing device 34. The I/O device 46 can comprise any device that enables an individual to interact with the computing device 344 or any device that enables the computing device 34 to communicate with one or more other computing devices using any type of communications link.

In any event, the computing device 34 can comprise any general purpose computing article of manufacture capable of executing computer program code installed thereon (e.g., a personal computer, server, handheld device, etc.). However, it is understood that the computing device 34 is only representative of various possible equivalent computing devices that may perform the processes described herein. To this extent, in other embodiments, the functionality provided by computing device 34 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 32 is only illustrative of various types of computer infrastructures for implementing the invention. For example, in one embodiment, the computer infrastructure 32 comprises two or more computing devices (e.g., a server cluster) that communicate over any type of communications link, such as a network, a shared memory, or the like, to perform the process described herein. Further, while performing the process described herein, one or more computing devices in the computer infrastructure 32 can communicate with one or more other computing devices external to computer infrastructure 32 using any type of communications link. In either case, the communications link can comprise any combination of various types of wired and/or wireless links; comprise any combination of one or more types of networks (e.g., the Internet, a wide area network, a local area network, a virtual private network, etc.); and/or utilize any combination of various types of transmission techniques and protocols. As discussed herein, the solver 36 enables computer infrastructure 32 to create the legalized layout 50.

Figure 4A:
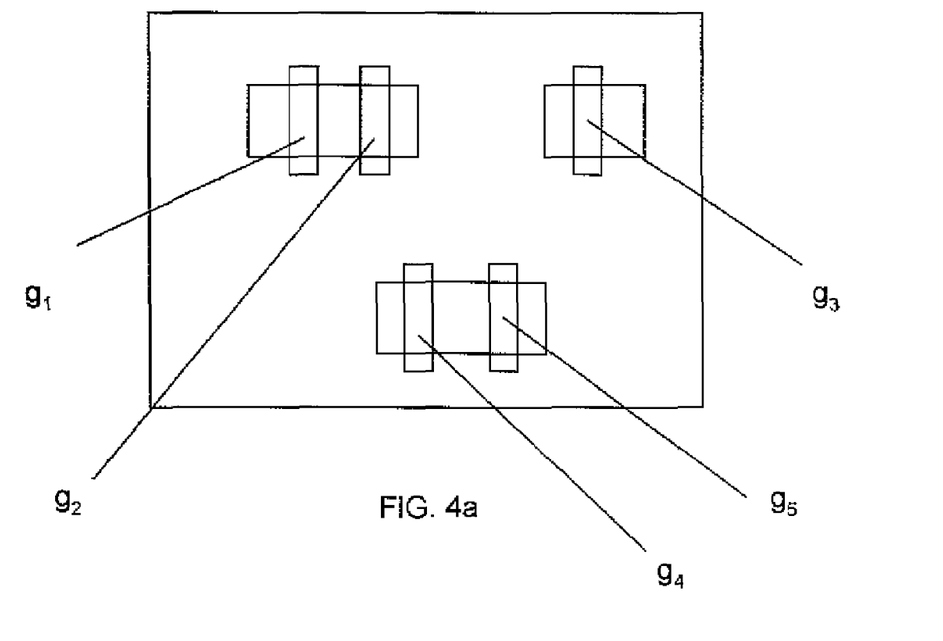
FIGS. 4a and 4b show a hierarchical design in layout form and in critical shape neighborhood graph form in accordance with the invention.
Figure 4B:
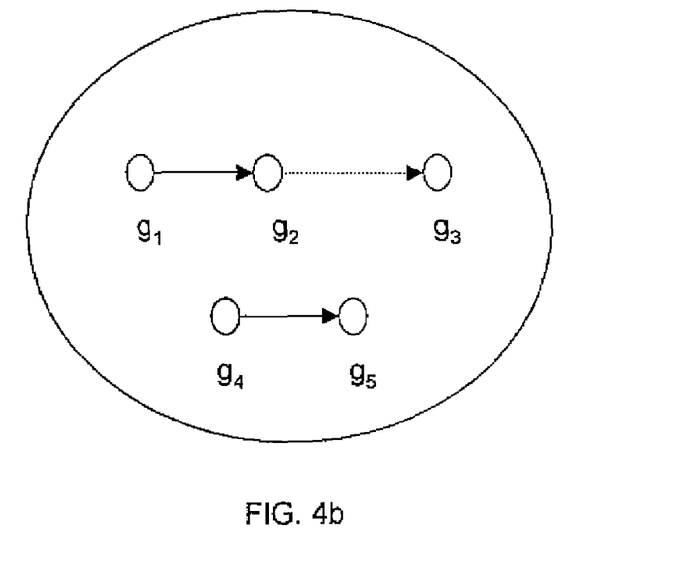

In such an environment, the grid constraints of a layout can be modeled as a critical shape neighborhood (CSN) graph, as shown in FIGS. 4a and 4b. In a CSN graph, each gate in the layout is represented by a node, and each arc between two nodes represents a grid constraint between the corresponding gates. For example, FIG. 4a shows a layout including gates $g_1$-$g_5$. The grid constraints in this layout can be modeled as a CSN graph as shown in FIG. 4b, where the nodes $n_1$-$n_5$ represent the gates $g_1$-$g_5$ from the layout, and arcs between the nodes $n_1$-$n_5$ represent the grid constraints between the gates $g_1$-$g_5$. From the CSN graph, a critical shape placement (CSP) solver can compute the integer solution for the target location of gates with MinPert objectives.

Figure 5A:
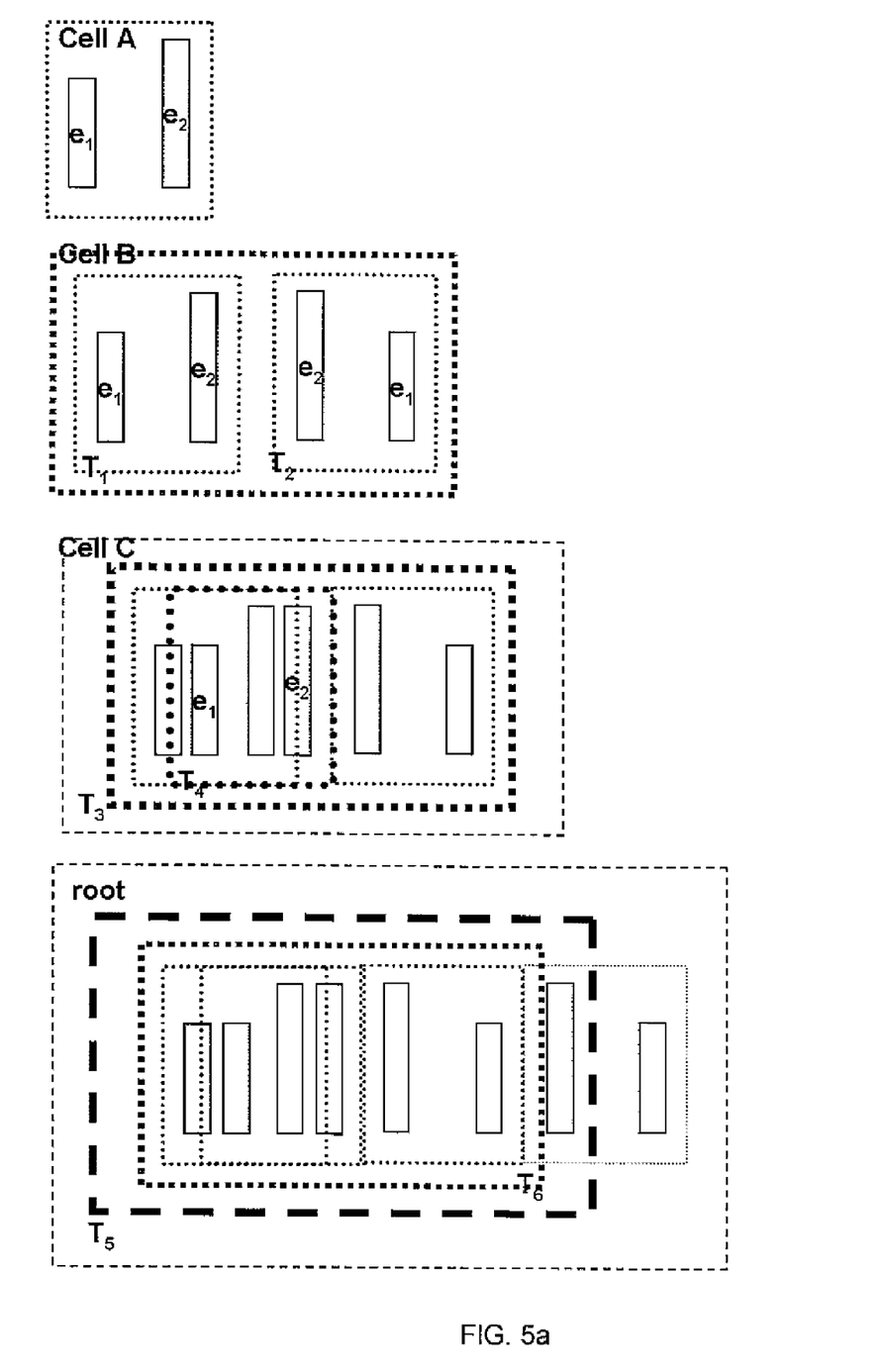
FIG. 5a and 5b are illustrative examples of a hierarchy layout and its hierarchy tree in accordance with the invention.
Figure 5B:
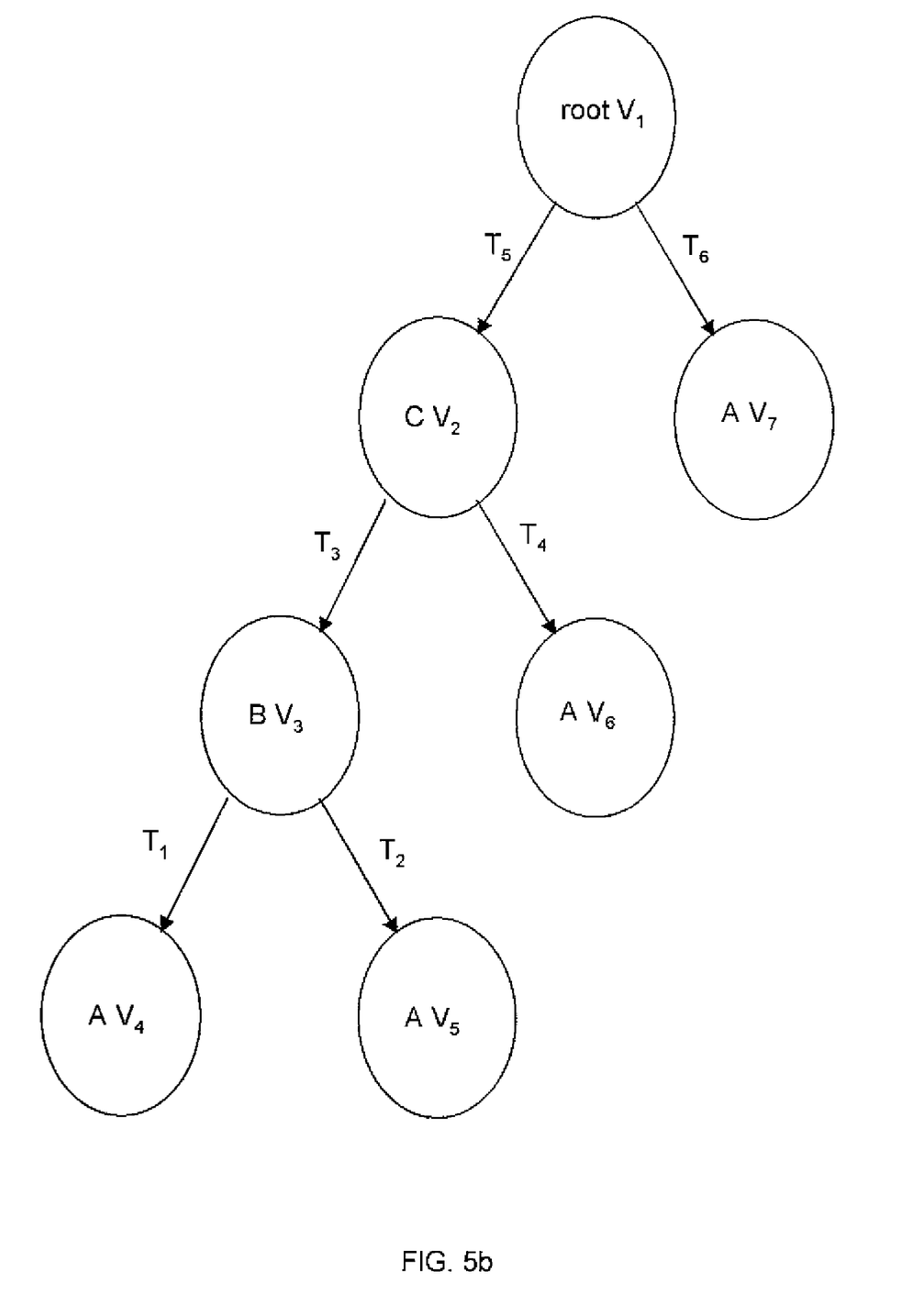

An example of a hierarchical layout is shown in FIG. 5a. In this representation, cell A is a leaf cell and has two native gates $e_1$ and $e_2$. Cell B includes two instances of cell A, one at transform $T_1$ and the other, which is mirrored, at transform $T_2$. Cell C includes one instance of cell A at transform $T_4$ and one instance of cell B at transform $T_3$. The root includes one instance of cell C at transform $T_5$ and a mirrored instance of cell A at transform $T_6$. The hierarchy information of the layout can be represented in a tree-like structure called hierarchy tree shown in FIG. 5b. In the hierarchy tree, each node corresponds to a cell, and each edge corresponds to a cell transform (where the cell $V_i$ is placed in its parent cell $V_j$) with edge direction from the parent cell node $V_j$ to the child cell node $V_i$ ($V_j$ is called the parent node of $V_i$). Each node $V_1$-$V_7$ corresponds to a cell, and an instance path is an ordered list of transforms that describes the set of transformations to apply to a cell in order to determine that cell's flat position with respect to the root cell. By traversing the nodes from root to node $V_i$, we can get a unique instance path, therefore an instance path can correspond to a node as well. Further, each node $V_1$-$V_7$ is indexed with monotone property (e.g., index$(V_i)$>index(parent node of $V_i$)). Path($V_c$,$V_d$) denotes the set of nodes on the path from $V_c$ to $V_d$, e.g. in FIG. 5b, Path($V_2$, $V_4$)={$V_2$,$V_3$,$V_4$}.

A flat-CSN graph can be built for the root (prime cell) in a hierarchical layout. In the flat-CSN graph each node $n_i$ represents a gate $g_i$ in the flat version of the hierarchical layout and corresponds to a node $V_j$ in the hierarchy tree, which is its complete instance path with respect to the root in the form of notation $IP(n_i)=V_j$ and a native gate $e_j$ of its native cell in the form of notiation $NG(n_i)=e_j$.

Figure 6A:
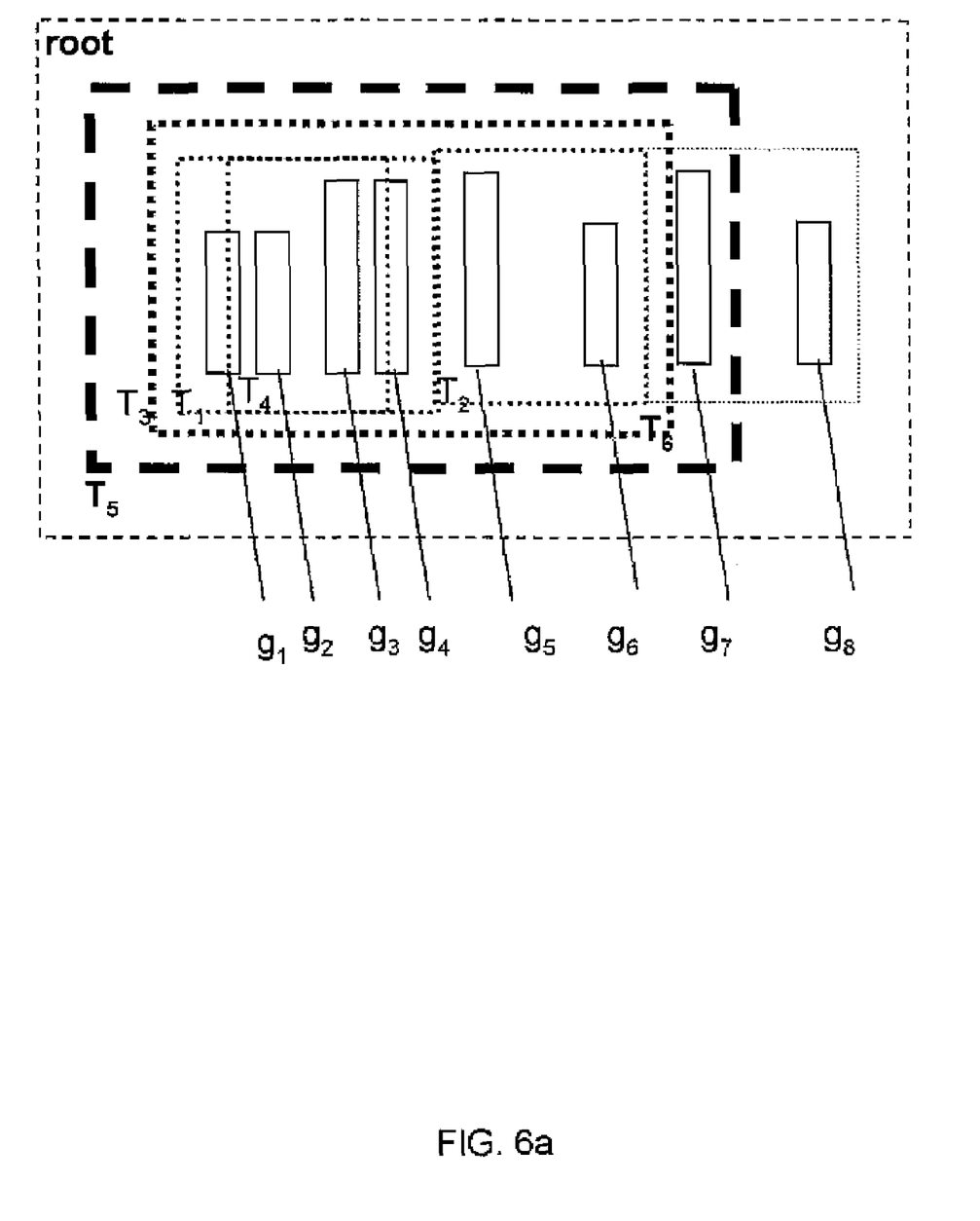
FIGS. 6a-6d are illustrative examples of a flat layout with grid constraints, a hierarchy tree of the same layout, and a flat critical shape neighborhood graph of the root of the same layout, in accordance with the invention.
Figure 6B:
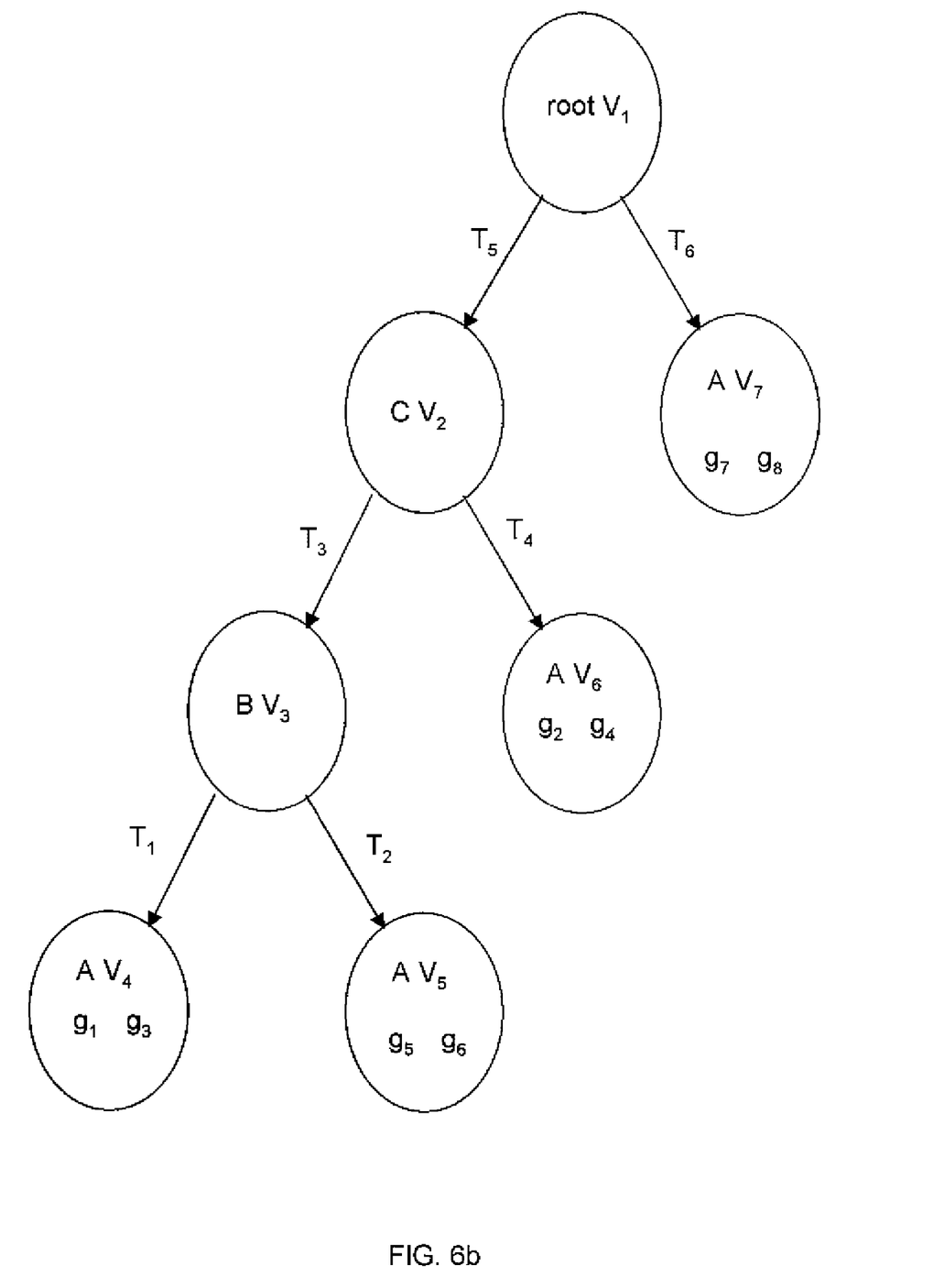
Figure 6C:
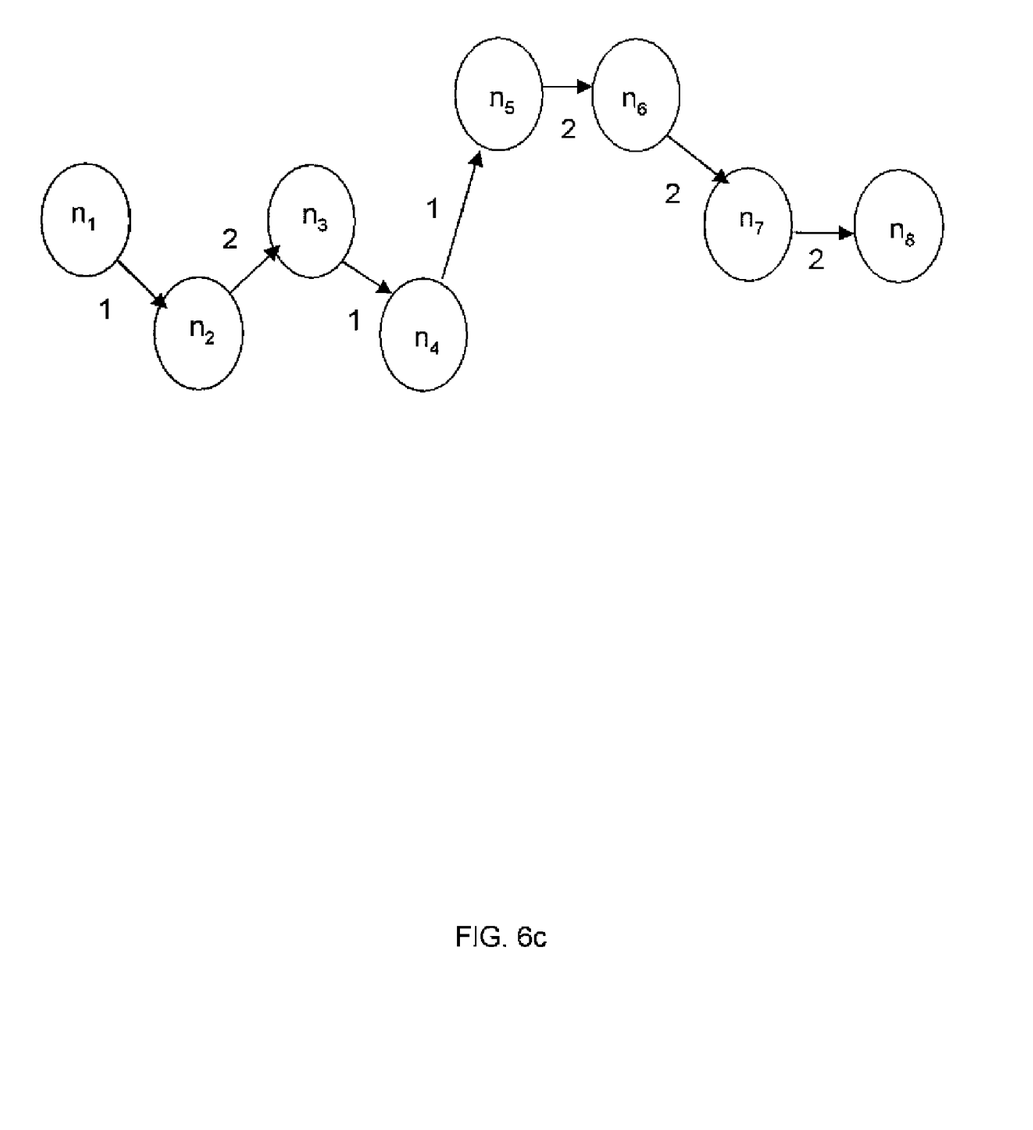

In order to obtain a list of flat grid constraints, the hierarchy tree and the flat CSN graph of the root in the hierarchical layout shown in FIG. 5*a* are built, as shown in FIGS. 6*b*-6*c*. The layout with flat gates being indexed as $g_1$-$g_8$ is shown in FIG. 6*a*, having cells A, B, and C and transforms $T_1$-$T_6$. From the layout shown in FIG. 6*a*, the hierarchical tree is extracted, as shown in FIG. 6*b*. This hierarchical tree shows nodes $V_1$-$V_7$, composed of cells A, B, and C, including gates $g_1$-$g_8$, all of which correspond to the information shown in FIG. 6*a*. FIG. 6*c* shows the flat CSN-graph of the root. From the hierarchy information represented by the hierarchy tree in FIG. 6*b*, the hierarchical information of the nodes in the flat-CSN graph can be derived. Thus:

$$IP(n_1)=V_4, IP(n_2)=V_6, IP(n_3)=V_4, IP(n_4)=V_6,$$
$$IP(n_5)=V_5, IP(n_6)=V_5, IP(n_7)=V_7, IP(n_8)=V_7;$$

and $$NG(n_1)=e_1, NG(n_2)=e_1, NG(n_3)=e_2, NG(n_4)=e_2,$$
$$NG(n_5)=e_2, NG(n_6)=e_1, NG(n_7)=e_2, NG(n_8)=e_1.$$

The flat location of each gate in the root is expressed by:

$$X(g_1)=T_5+T_3+T_1+e_1;$$

$$X(g_2)=T_5+T_4+e_1;$$

$$X(g_3)=T_5+T_3+T_1+e_2;$$

$$X(g_4)=T_5+T_4+e_2;$$

$$X(g_5)=T_5+T_3+T_2-e_2;$$

$$X(g_6)=T_5+T_3+T_2-e_1;$$

$$X(g_7)=T_6-e_2; \text{ and}$$

$$X(g_8)=T_6-e_1.$$

In the heuristic CSP solver, each arc between two nodes is assigned an integer value weight which represents the minimum spacing between the gates in units of the grid pitch P. Each arc is either solid or dashed, with the solid arcs representing that the two gates share the same diffusion island; whereas, the dashed arcs represent that the two gates do not share the same diffusion island. Given the flat or hierarchical layout, the flat-CSN graph can be extracted from the layout to represent the grid constraints on the gates, however it can not represent the hierarchy constraints.

The legalization problem for grid constraints on gates in a hierarchical design can be formulated as an integer linear programming problem (ILP) problem. The ILP problem can capture the hierarchical constraints, which are embedded in variable definitions. This also provides a global picture of the problem for optimization. In general solving ILP problem is very expensive. However, if the ILP is solved as a continuous (real-valued) linear programming (LP) problem, then the rounding problem of the LP result must be resolved, which is quite complex.

One hierarchical grid constraint may correspond to multiple flat grid constraints. That is, one hier-CSN-graph (hierarchical CSN-graph) arc may correspond to multiple flat CSN-graph arcs. In this case the weight of the hier-CSN-graph arc is the maximum of the weights of its corresponding flat CSN-graph arcs. In this example, the flat constraints are expressed by:

$$E(g_1,g_2): X(g_2)-X(g_1)=(T_5+T_4+e_1)-(T_5+T_3+T_1+e_1)$$
$$\geq 1;$$

$$E(g_2,g_3): X(g_3)-X(g_2)=(T_5+T_3+T_1+e_2)-(T_5+T_4+e_1)$$
$$\geq 2;$$

$$E(g_3,g_4): X(g_4)-X(g_3)=(T_5+T_4+e_2)-(T_5+T_3+T_1+e_2)$$
$$\geq 1;$$

$$E(g_4,g_5): X(g_5)-X(g_4)=(T_5+T_3+T_2-e_2)-(T_5+T_4+e_2)$$
$$\geq 1;$$

$$E(g_5,g_6): X(g_6)-X(g_5)=(T_5+T_3+T_2-e_1)-(T_5+T_3+T_2-e_2)$$
$$\geq 2;$$

$$E(g_6,g_7): X(g_7)-X(g_6)=(T_6-e_2)-(T_5+T_3+T_2-e_1)\geq 2;$$
and $$E(g_7,g_8): X(g_8)-X(g_7)=(T_6-e_1)-(T_6-e_2)\geq 2.$$

In embodiments, the hierarchical grid constraints are modeled as a set of hierarchical CSN graphs. For each cell in the hierarchy, there is a CSN-graph where the arc weight represents the minimum spacing between two gates in the context of hierarchy and root. In order to distinguish it from the stand-alone leaf cell legalization process, this is referred to as the hier-CSN-graph. The complete hierarchical grid constraints are represented by the set of hier-CSN-graphs.

In embodiments, the flat CSN-graph is generated for the root in the design by running a scanline procedure on the root to identify the flat gate adjacency. A scanline procedure will be understood by one of skill in the art to be used to extract up-down or left-right relationships between edges or shapes. In the flat CSN graph of the root, each node represents a (set of) gate(s) in the flat view of the root and each arc represents a grid constraint with respect to the flat view of the root. Each arc is either solid or dashed to indicate if there is a diffusion break between the two gates, and each arc has an integer-value weight which is the minimum spacing between the gates in the pitch units. A set of hier-CSN graphs is built for cells in the hierarchy based on the flat CSN graph of the root and on the hierarchy information.

In the hier-CSN graph of a cell A, a node represents either: (i) a (set of aligned) native gate(s) of cell A; or (ii) a (set of aligned) port gate(s) of an instance of cell B which is placed in cell A. The port gates are defined as the gates of cell B which have adjacent gates outside of cell B. Each hier-CSN graph of a cell is used by the CSP solver to determine the on-grid location for the gates, and the whole set of hier-CSN graphs is used to generate the linear constraints in the LP problem formulation for the LP solver to solve. The arcs in the hier-CSN-graphs are referred to as hierArcs, in order to distinguish them from the arcs in the flat CSN graph of the root. For the layout shown in FIG. 6*a*, the hierarchical grid constraints for the LP solver are expressed as:

$$(T_4+e_1)-(T_3+T_1+e_1)\geq 1 \text{ (cell } C\text{);}$$

$$(T_3+T_1+e_2)-(T_4+e_1)\geq 2 \text{ (cell } C\text{);}$$

$$(T_4+e_2)-(T_3+T_1+e_2)\geq 1 \text{ (cell } C\text{);}$$

$$(T_3+T_2+e_2)-(T_4+e_2)\geq 1 \text{ (cell } C\text{);}$$

$$(-e_1)-(-e_2)\geq 2 \text{ (cell } A\text{); and}$$

$$(T_6-e_2)-(T_5+T_3+T_2-e_1)\geq 2 \text{ (root).}$$

However, it is not enough for the CSP solver to correctly determine the target on-grid locations of gates, because there are some transitive arcs which are not in the flat CSN graph, which are thus missing from the hierarchical grid constraint set. For example, from the flat CSN graph, a hierArc can be derived from $e_1$ to $e_2$ for cell A with a weight of 2, which is the maximum of its corresponding flat CSN-graph arcs' weights, but there is a path in the flat CSN graph from $n_1$ to $n_3$ with path length (sum of the weights of the arcs in the path) of 3, which shall be the minimum spacing between $e_1$ and $e_2$. If weight of 2 is assigned and used by the CSP solver to determine the target locations of gate, then the result will not lead to a feasible solution for the root.

Figure 6D:
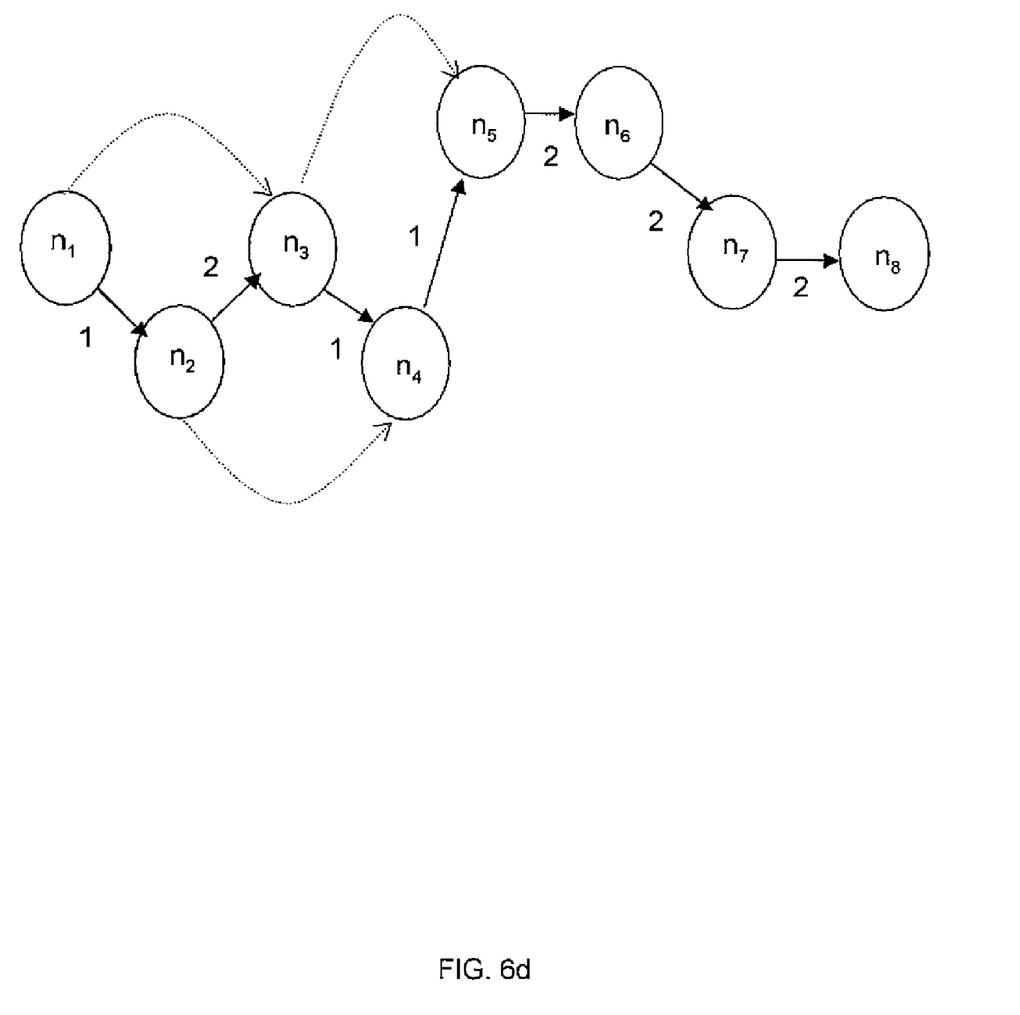
Figure 7A:
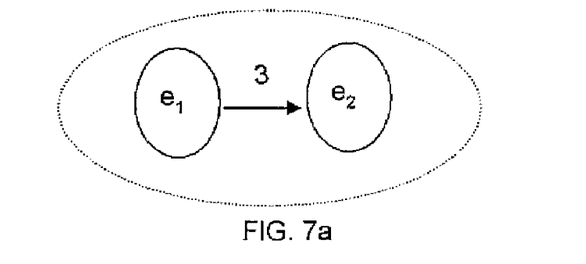
FIGS. 7a-7d illustrate step(s) in accordance with the invention including building a flat CSN graph of the root.
Figure 7B:
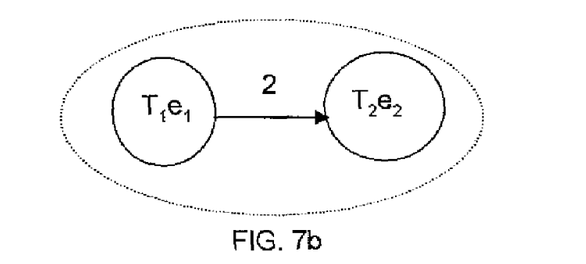
Figure 7C:
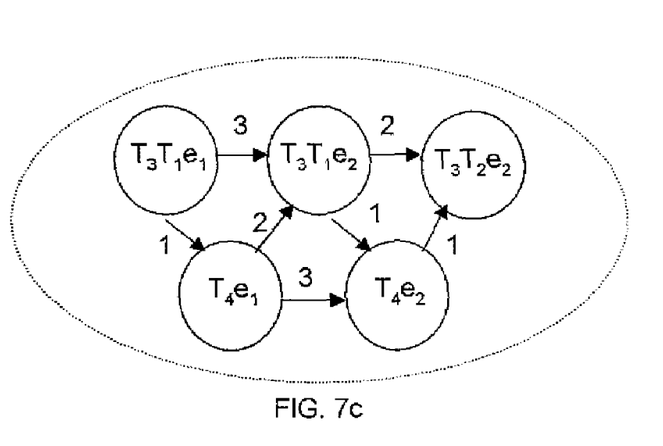
Figure 7D:
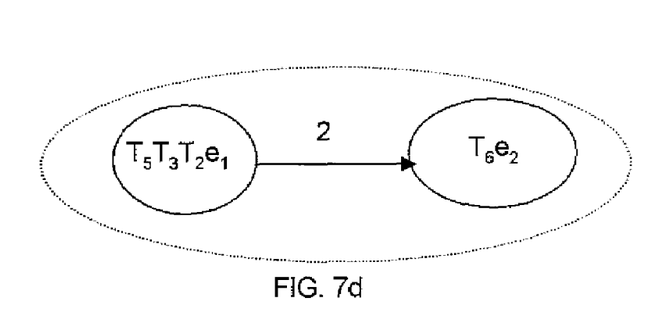

In FIG. 6d, the dotted lines show the transitive arcs (tranArcs) on the flat CSN-graph. As will be understood by one of skill in the art, a transitive arc is not an arc in the flat CSN graph of the root; rather it corresponds to a path in the flat CSN graph, and is implicitly derived from the arcs in the flat CSN graph of the root. A tranArc connecting two nodes $n_a$ and $n_b$ in the flat CSN graph should satisfy the following three conditions:

1. there is a path $P(n_a, n_b)$ arc from $n_a$ to $n_b$ in the flat CSN graph, but there is no direct arc from $n_a$ to $n_b$;
2. $n_a$ and $n_b$ belong to the same instance, $Inst_k$; and
3. there are no other node(s) which belong to instance $Inst_k$ on path $P(n_a, n_b)$.

In order to derive tranArc from the flat-CSN graph, we use the propagation information which is represented by the 3-tuple $TP_i = <N_i, VS_{pi}, ET_i>$. In this notation, $N_i$ are the nodes on the flat-CSN graph; $VS_{pi}$ are a set of hierarchy tree nodes $\{V_{pj}\}$ in Path(root, $IP(N_i)$) in decreasing order of the index; and $ET_i$ are boolean flags to represent the type of edge (e.g., false for solid type, true for dashed type). Given two 3-tuples $TP_i$ and $TP_j$, the Match($VS_{pi}$, $VS_{pj}$) is computed as $V_m$, the deepest instance path shared by both sets, with largest index m if $V_m$ exists in $VS_{pi}$ and $VS_{pj}$; otherwise, set Match($VS_{pi}$, $VS_{pj}$) to empty. The ancestor information is propagated on the flat CSN-graph nodes as a set of 3-tuples in the form of $<N_i, VS_{pi}, ET_i>$, denoted as Ancst($N_b$)=$\{TP_{b1}, TP_{b2}, \ldots\}$. A node $n_a$ is called ancestor node of node $n_b$ if there is a path from $n_a$ to $n_b$ in the flat CSN-graph. For each node $V_i$ in the hierarchy tree (except the root), use Bound($V_i$) to refer a set of the flat CSN-graph nodes $n_i$ which represents the gate with the largest coordinate in the compacted flat layout and $V_i$ in Path(root, $IP(n_i)$). For the layout shown in FIG. 6a-6c, we can derive Bound($V_2$)=$\{n_6\}$, Bound($V_3$)=$\{n_6\}$, Bound($V_4$)=$\{n_3\}$; Bound($V_5$)=$\{n_6\}$, Bound($V_6$)=$\{n_4\}$, Bound($V_7$)=$\{n_8\}$.

The tranArc is extracted by the following steps:
1. for each flat CSN-graph arc $E(n_c, n_d)$, check if tranArcs exist between the ancestor nodes of $n_c$ and $n_d$;
2. propagate a set of ancestor nodes to $g_d$; and
3. propagate the necessary transitivity relationship using careful pruning techniques.

The pruning techniques are:
1. match the deepest shared instance path between two sets of instance paths, noting that it is not necessary to match and propagate the shallow instance path. The sorted hierarchy tree nodes help to prune and compute the deepest instance path; and
2. it is not necessary to propagate the nodes in Bound($V_i$) when the extracted tranArc belongs to an instance path corresponding to $V_i$.

The tranArcs are expressed as:

$E(n_3, n_5): (T_2-e_2)-(T_1+e_2) \geq 2$ (cell B);

$E(n_1, n_3): (e_2)-(e_1) \geq 3$ (cell A); and $E(n_2, n_4): (e_2)-(e_1) \geq 3$ (cell A).

Given a hierarchical layout, there are iterations between global optimization done by the LP solver, which is based on the hierarchy structure, and bottom-up local legalization done by the CSP solver, which is based on the results from LP solution. From level of the first leaf cell to the level of the root, at each level, an LP is formulated and solved based on current variables and hierarchical grid constraints. Then, for each cell at each level (the cell of any instance inside that cell already having been processed (placed) at a previous level), the results of native gates and transforms from the LP solution are used as the initial locations of the gates to determine the target on-grid locations of gates using the CSP solver.

Once the target on-grid location of gates are determined, the corresponding variables (either variables for gates or transforms) can be determined, and those variables are taken out of the LP formulation in the next iteration. By using the LP formulation for global optimization and the CSP solver for local constraint legalization, and resolving the integer value for variables in an iterative fashion, the two methods compensate for each other and provide a superior result.

Given the set of hierarchical grid constraints and the transitive arc constraints, a set of hier-CSN graphs is built for cells in the hierarchy as shown in FIGS. 7a-7d. A node in the hier-CSN graph of a cell represents either a native gate, (e.g., $e_1$ of cell A's hier-CSN graph), or a port gate of a cell, which is placed under another cell and has adjacent gates outside itself, (e.g., $T_1e_1$ of cell B's hier-CSN graph, which represents transform $T_1$ and gate $e_1$). The target on-grid location for a port gate is used to derive the target location of the transform which the port gate represents. Because cell A is first to be processed by the CSP solver, the target location for $e_1$ is determined before the target location for port gate $T_1e_1$.

Figure 8A:
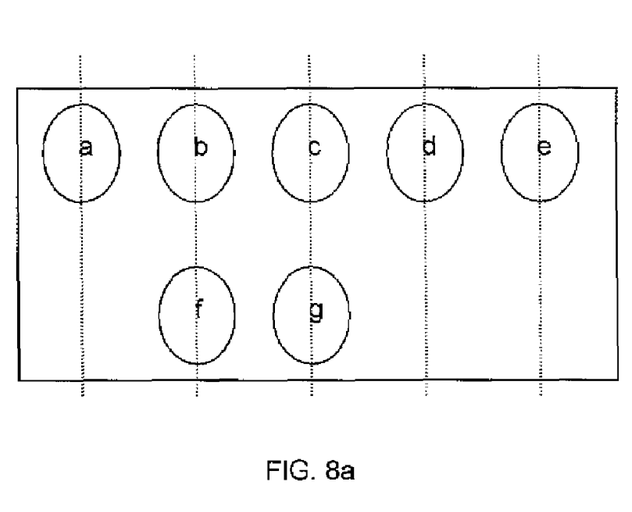
FIGS. 8a and 8b illustrate step(s) in accordance with the invention including building a set of hier-CSN graphs.
Figure 8B:
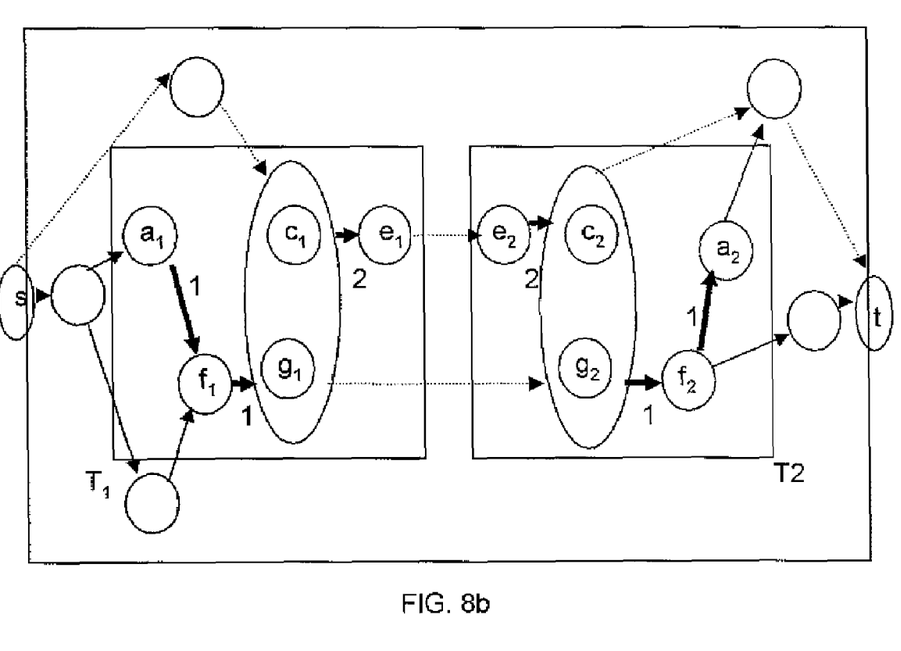

FIG. 8 shows cell A placed on a grid and its CSN graph. FIG. 8b shows cell B, which consists of two instances of cell A, one placed at transform $T_1$, the other mirrored and placed at transform $T_2$, and several native gates. The port nodes of cell A are a, c, e, f, and g, and because nodes c and g are placed on the same grid, they are modeled by the same port node. Fixed arcs connect the port nodes in a topological order. After determining the port node location, the transform location can be derived. For example, $X(a_1)=E_a+T_1$, $X(a_2)=T_2-E_a$, such that $T_1=X(a_1)-E_a$, and $T_2=X(a_2)-E_b$.

The port node of an instance is extracted and used to represent the transform location. The port node represents the gate (referred to as the port gate) of an instance which is adjacent to gates outside of this instance. The port gate is identified by checking the edges in/out from the instances. Each port node represents a unique location of a set of port gates with the same location. The CSN graph is modified by adding a fixed edge between the port nodes of an instance (connecting them via a link from the left-most port node to the right-most port node); if the instance is mirrored, the edge direction is reversed. The CSP solver is run with the following change: when a port node is placed, all the other port-nodes of the same instance are immediately placed using the fixed-edge weight.

Figure 9:
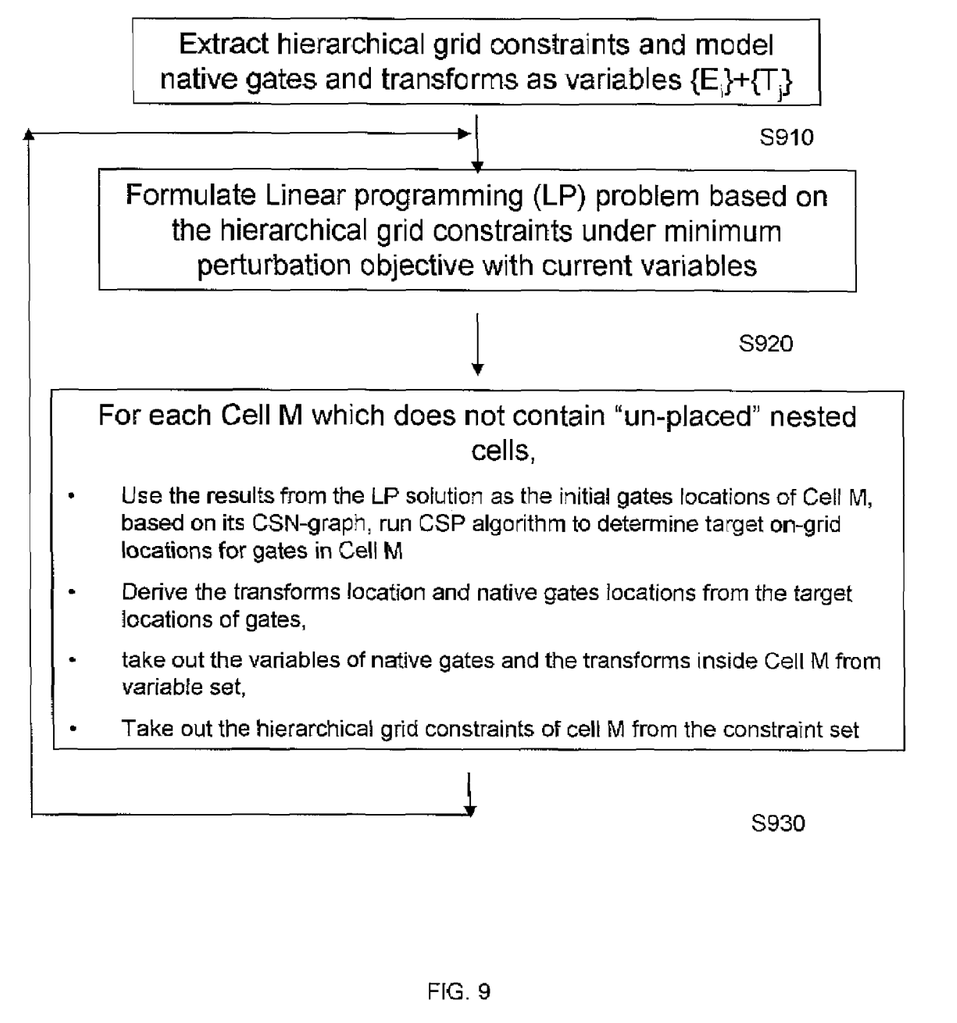
FIG. 9 is a flow chart illustrating steps in accordance with the invention.

FIG. 9 is a flow diagram implementing the steps of the invention. FIG. 9 (and all other flow diagrams) may equally represent a high-level block diagram of the invention. The steps of the flow diagrams may be implements and executed either from a server, in a client-server relationship, or they may run on a user workstation with operative information conveyed to the use workstation to create the navigation outlined above.

As shown in FIG. 9, in S910 the hierarchical grid constraints are extracted. Given a flat constraint between gate $g_a$ in cell A and gate $g_b$ in cell B, then the hierarchy information is used to find the nearest common ancestor of cells A and B in the hierarchy, and to derive the hierarchical grid constraint for their nearest common ancestor cell C. Multiple flat constraints may correspond to one hierarchical grid constraint. In S920, the LP problem is formulated based on the hierarchical grid constraints under the MinPert objective with current variables.

In S930, for each cell M that does not contain un-placed nested cells, the results from the linear programming solution are used as initial gates locations of cell M, based on its critical shape neighborhood graph run by a critical shape placement solver to determine target on-grid locations for gates in cell M. The transforms location and native gates locations are derived from the target locations of gates. The variables of native gates and the transforms inside cell M are taken out of the variables set. The hierarchical grid constraints of cell M are taken out of the constraint set. As is shown in FIG. 9, the process is then iteratively repeated, reformulating the linear programming problem with the variables derived from each previous step.

The solver can extract both tranArc and the hierArc. It comprises two passes. In the first pass, longest path is computed from source to sink on a flat-CSN graph; the compacted location is determined for each node $n_i$ as $\min_X(n_i)$, the flat CSN-graph nodes with the largest value of $\min_x(n_i)$ and $V_i$ in Path(root, $IP(n_i)$) for setting Bound($V_i$) are determined for each instance path (represented and indexed as $V_i$), and for each node $n_i$ set Ancst($n_i$)=$\phi$.

In the second pass, each node $n_b$ is visited in topological order, for its fanin arc E($n_a$, $n_b$), if the edge type is solid, let ET=false, else ET=true. Let $VS_a$={$V_{ai}$, |$V_{ai}$ in Path(root, $IP(n_a)$)}, $VS_b$={$V_{bi}$, |$V_{bi}$ in Path(root, $IP(n_b)$)}. Let $V_m$=Match ($VS_a$, $VS_b$), extract hierarchical arc from the flat CSN-graph arc E($n_a$, $n_b$). Let $VS_{bm}$=$VS_b$−{$V_i$ in Path(root, $V_m$)}, set $TP_b$=<$N_b$, $VS_{bm}$, ET>. Set $VS_{ap}$=$V_a$−{$V_i$ in Path(root, $V_m$)}−{$V_i$|$n_a$ in Bound($V_i$)}. Check the transitivity between Ancst ($n_a$)={$TP_{ai}$=<$n_{ai}$, $VS_{ai}$, $ET_{ai}$>|i=1, ... p} and $TP_b$=<$n_b$, $VS_{bm}$, ET>. If Match($VS_{ai}$, $VS_{bm}$) equals to $V_{mi}$ and $V_{mi}$ is not $\phi$, then extract transitive arc e($n_{ai}$, $n_b$) with edge type of ($ET_{ai}$||ET); $VS_{ai}$=$VS_{ai}$−{$V_i$|$V_i$ in Path(root, $V_{mi}$)}; if $VS_{ai}$ is $\phi$, set Ancst($n_a$) to Ancst($n_a$)−{$TP_{ai}$}. Set Ancst($n_b$)=Ancst ($n_a$); if $VS_{ap}$ is not $\phi$, let $TP_a$=<$n_a$, $VS_{ap}$, ET>, Ancst($n_b$)= Ancst($n_b$)+{$TP_a$}.

Referring again to FIG. 9, the LP problem is formulated and updated. At each level in the hierarchy, given the hierarchical grid constraints and the undetermined variables of edges and transform, the LP problem is formulated with the minimum perturbation objective. As the iterations progress, the number of hierarchical grid constraints and variables decreases. This process is repeated until all variables are solved.

The present invention can take the form of an entirely hardware embodiment, an entirely software embodiment or an embodiment containing both hardware and software elements. In a preferred embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practices with modifications and in the spirit and scope of the appended claims.

What is claimed:

1. A method comprising:
   extracting a hierarchical grid constraint set;
   modeling one or more critical objects of at least one cell as a variable set;
   solving a linear programming problem based on the hierarchical grid constraint set with the variable set to provide initial locations of the critical objects of the at least one cell; and
   determining target on-grid locations of the one or more critical objects in the at least one cell using the results of the linear programming solution.

2. The method of claim 1, wherein the modeling includes the modeling of transforms.

3. The method of claim 2, further comprising deriving a location of a transform and the one or more critical objects from the target on-grid locations.

4. The method of claim 3, further comprising removing the variable set variable of the critical objects and the transforms inside the one or more cells.

5. The method of claim 1, further comprising removing from the hierarchical grid constraint set hierarchical grid constraints of the one or more cell.

6. The method of claim 1, further comprising formulating a linear programming problem to be solved based on the hierarchical grid constraint set under minimum perturbation objectives.

7. The method of claim 1, wherein:
the one or more cells are a plurality of cells, each comprising one or more critical objects;
the variable set includes variables from the plurality of cells and the hierarchical grid constraint set includes constraints from the plurality of cells; and
the variables and the constraints of one cell of the plurality of cells are removed from the variable set; and
further comprising:
solving the linear programming problem based on the hierarchical grid constraint set with current variables of a next cell of the plurality of cells;
providing initial locations of the critical objects of the next of the plurality of cells; and
determining target on grid locations of the one or more critical objects in the next cell using results of the linear programming solution based on the hierarchical grid constraint set with current variables of the next cell.

8. The method of claim 7, further comprising repeating the steps of claim 7 until no further cells of the plurality of cells are present.

9. The method of claim 7, wherein the one or more cells further comprise one or more transforms.

10. The method of claim 1, wherein the modeling step further comprises extracting at least one hierarchical tree from a flat layout.

11. The method of claim 1, wherein the modeling step further comprises extracting at least one hierarchical critical shape neighborhood graph.

12. The method of claim 1, wherein the critical objects are gates or transistors.

13. The method of claim 1, wherein the determining step further comprises computing an integer solution for the target on-grid locations of gates with minimum perturbation objectives.

14. A system for legalizing artwork, comprising at least one device configured to:
extract a hierarchical grid constraint set;
model one or more critical objects of the at least one cell including native gates and transforms as variables;
formulate a linear programming problem based on the hierarchical grid constraint set under minimum perturbation objectives with the variables under consideration;
solve the linear programming problem to provide initial locations of the critical objects of the at least one cell; and
for each cell which does not contain unplaced nested cells, determine target on-grid locations of the one or more critical objects using the results of the linear programming solution.

15. The system of claim 14, wherein the one or more cells are a plurality of cells, each comprising one or more critical objects, the variables and the hierarchical grid constraint set includes constraints from the plurality of cells and the variables and the constraints of the cell under consideration are removed; wherein the device is configured to further:
solve the linear programming problem based on the hierarchical grid constraint set with current variables of a next cell of the plurality of cells;
provide initial locations of the critical objects of the next of the plurality of cells; and
determine target on grid locations of the one or more critical objects in the next of the plurality of cells using the results of the linear programming solution based on the hierarchical grid constraint set with the current variables.

16. The system of claim 14, wherein the device is configured to repeat iterations until no further cells of the plurality of cells are present.

17. The system of claim 14, wherein the device is further configured to extract at least one hierarchical tree from a flat layout.

18. The system of claim 14, wherein the device is a computer program product comprising a computer useable medium including an executable computer readable program.

19. The system of claim 14, wherein the device is configured to manufacture semiconductor devices.

20. A computer program product comprising a computer useable medium including a computer readable program, wherein the computer readable program, when executed on a computer, causes the computer to:
extract hierarchical grid constraints;
model critical objects of at least one cell as variables;
solve a linear programming problem based on the hierarchical grid constraints with the variables to provide initial locations of the critical objects; and
determine target on-grid locations of the critical objects using the results of the linear programming solution.

* * * * *